(12) United States Patent
Tang et al.

(10) Patent No.: US 8,754,440 B2
(45) Date of Patent: Jun. 17, 2014

(54) LIGHT-EMITTING DIODE (LED) PACKAGE SYSTEMS AND METHODS OF MAKING THE SAME

(75) Inventors: Yu-Sheng Tang, Qishan Township (TW); Hsin-Hung Chen, Hsinchu (TW); Hao-Wei Ku, Zhudong Township (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 11 days.

(21) Appl. No.: 13/053,607

(22) Filed: Mar. 22, 2011

(65) Prior Publication Data

US 2012/0241784 A1 Sep. 27, 2012

(51) Int. Cl.
*H01L 33/50* (2010.01)
*H01L 33/52* (2010.01)
*H01L 33/54* (2010.01)

(52) U.S. Cl.
CPC ............ *H01L 33/54* (2013.01); *H01L 33/505* (2013.01)
USPC ...................................................... 257/100

(58) Field of Classification Search
USPC ............ 257/99, 100, 787, 788, 795, E33.056, 257/E33.058, E33.059
See application file for complete search history.

(56) References Cited

U.S. PATENT DOCUMENTS

| | | | |
|---|---|---|---|
| 6,635,363 B1 * | 10/2003 | Duclos et al. ............... 428/690 |
| 6,809,342 B2 * | 10/2004 | Harada ........................... 257/79 |
| 7,038,246 B2 * | 5/2006 | Uemura ......................... 257/98 |
| 7,498,734 B2 * | 3/2009 | Suehiro et al. ............... 313/502 |
| 7,906,790 B2 * | 3/2011 | Radkov et al. .................. 257/98 |
| 7,968,900 B2 * | 6/2011 | Hussell et al. .................. 257/99 |
| 8,212,275 B2 * | 7/2012 | Yamada ......................... 257/98 |
| 2004/0223315 A1 * | 11/2004 | Suehiro et al. ................ 362/84 |
| 2005/0006659 A1 * | 1/2005 | Ng et al. ........................ 257/99 |
| 2005/0139851 A1 * | 6/2005 | Sato .............................. 257/99 |
| 2005/0248271 A1 * | 11/2005 | Ng et al. ...................... 313/512 |
| 2005/0263777 A1 * | 12/2005 | Yano et al. .................... 257/79 |
| 2006/0054913 A1 * | 3/2006 | Hadame et al. ................ 257/99 |
| 2006/0065906 A1 * | 3/2006 | Harada ........................... 257/98 |
| 2006/0124953 A1 * | 6/2006 | Negley et al. ................. 257/99 |
| 2007/0012940 A1 * | 1/2007 | Suh et al. ....................... 257/99 |
| 2007/0064131 A1 * | 3/2007 | Sawanobori et al. ......... 348/294 |
| 2008/0048200 A1 * | 2/2008 | Mueller et al. ................ 257/98 |
| 2008/0049430 A1 * | 2/2008 | Sakumoto .................... 362/296 |
| 2008/0213928 A1 * | 9/2008 | Harada ......................... 438/26 |
| 2008/0299398 A1 * | 12/2008 | Hata et al. ................... 428/412 |
| 2009/0021140 A1 * | 1/2009 | Takasu et al. ............... 313/502 |
| 2009/0072255 A1 * | 3/2009 | Takahashi et al. ............ 257/98 |
| 2009/0101929 A1 * | 4/2009 | Mo et al. ....................... 257/98 |
| 2009/0115313 A1 * | 5/2009 | Lu et al. ...................... 313/503 |
| 2009/0134420 A1 * | 5/2009 | Nagai .......................... 257/98 |

(Continued)

FOREIGN PATENT DOCUMENTS

WO  WO 2009119038 A2 * 10/2009

OTHER PUBLICATIONS http://dictionary.com, definition of "flush", 2013.*

(Continued)

*Primary Examiner* — Michele Fan
(74) *Attorney, Agent, or Firm* — Haynes and Boone, LLP

(57) ABSTRACT

A light-emitting diode (LED) package system includes a LED disposed over a surface of a substrate. A molding material covers the LED. A phosphor-containing material is disposed over and spaced from the LED by the molding material.

18 Claims, 6 Drawing Sheets

(56) References Cited

U.S. PATENT DOCUMENTS

| | | | |
|---|---|---|---|
| 2009/0278151 A1* | 11/2009 | Kim | 257/98 |
| 2009/0302342 A1* | 12/2009 | Kondo et al. | 257/98 |
| 2009/0309116 A1* | 12/2009 | Kato et al. | 257/98 |
| 2010/0117106 A1* | 5/2010 | Trottier | 257/98 |
| 2010/0127291 A1* | 5/2010 | Chang | 257/98 |
| 2010/0164365 A1* | 7/2010 | Yoshino et al. | 313/503 |
| 2010/0207511 A1* | 8/2010 | Harada | 313/501 |
| 2010/0207512 A1* | 8/2010 | Miyagawa et al. | 313/503 |
| 2010/0219745 A1* | 9/2010 | Tanimoto et al. | 313/498 |
| 2011/0001148 A1* | 1/2011 | Sun et al. | 257/88 |
| 2011/0006329 A1* | 1/2011 | Fujita et al. | 257/98 |
| 2011/0006673 A1* | 1/2011 | Yano et al. | 313/512 |
| 2011/0018026 A1* | 1/2011 | Konno et al. | 257/100 |
| 2011/0019707 A1* | 1/2011 | Sato et al. | 372/45.01 |
| 2011/0039359 A1* | 2/2011 | Takasu et al. | 438/27 |
| 2011/0045619 A1* | 2/2011 | Ling | 438/29 |
| 2011/0062469 A1* | 3/2011 | Camras et al. | 257/98 |
| 2011/0084297 A1* | 4/2011 | Ogata et al. | 257/98 |
| 2011/0096560 A1* | 4/2011 | Ryu et al. | 362/510 |
| 2011/0098420 A1* | 4/2011 | Takizawa et al. | 525/477 |
| 2011/0156072 A1* | 6/2011 | Ling | 257/98 |
| 2011/0176301 A1* | 7/2011 | Liang et al. | 362/231 |
| 2011/0260178 A1* | 10/2011 | Bierhuizen | 257/88 |
| 2011/0279998 A1* | 11/2011 | Su et al. | 362/84 |
| 2012/0012873 A1* | 1/2012 | Lin | 257/98 |

OTHER PUBLICATIONS http://www.thefreedictionary.com, definition of "flush", 2013, see p. 4.*

* cited by examiner

LIGHT-EMITTING DIODE (LED) PACKAGE SYSTEMS AND METHODS OF MAKING THE SAME

TECHNICAL FIELD

The present disclosure relates generally to the field of semiconductor package systems and, more particularly, to light-emitting diode (LED) package systems and methods of making the same.

BACKGROUND OF THE DISCLOSURE

Light-emitting diodes (LEDs) are semiconductor light sources and have been used to replace conventional fluorescent lamp sources. Conventionally, LEDs are semiconductor diodes made from compound materials. If the diodes are forward biased, electrons supplied from a node recombine with holes supplied from another node, releasing energy in the form of photons. By selecting the compound materials, emission colors of the LEDs can vary from red to blue.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
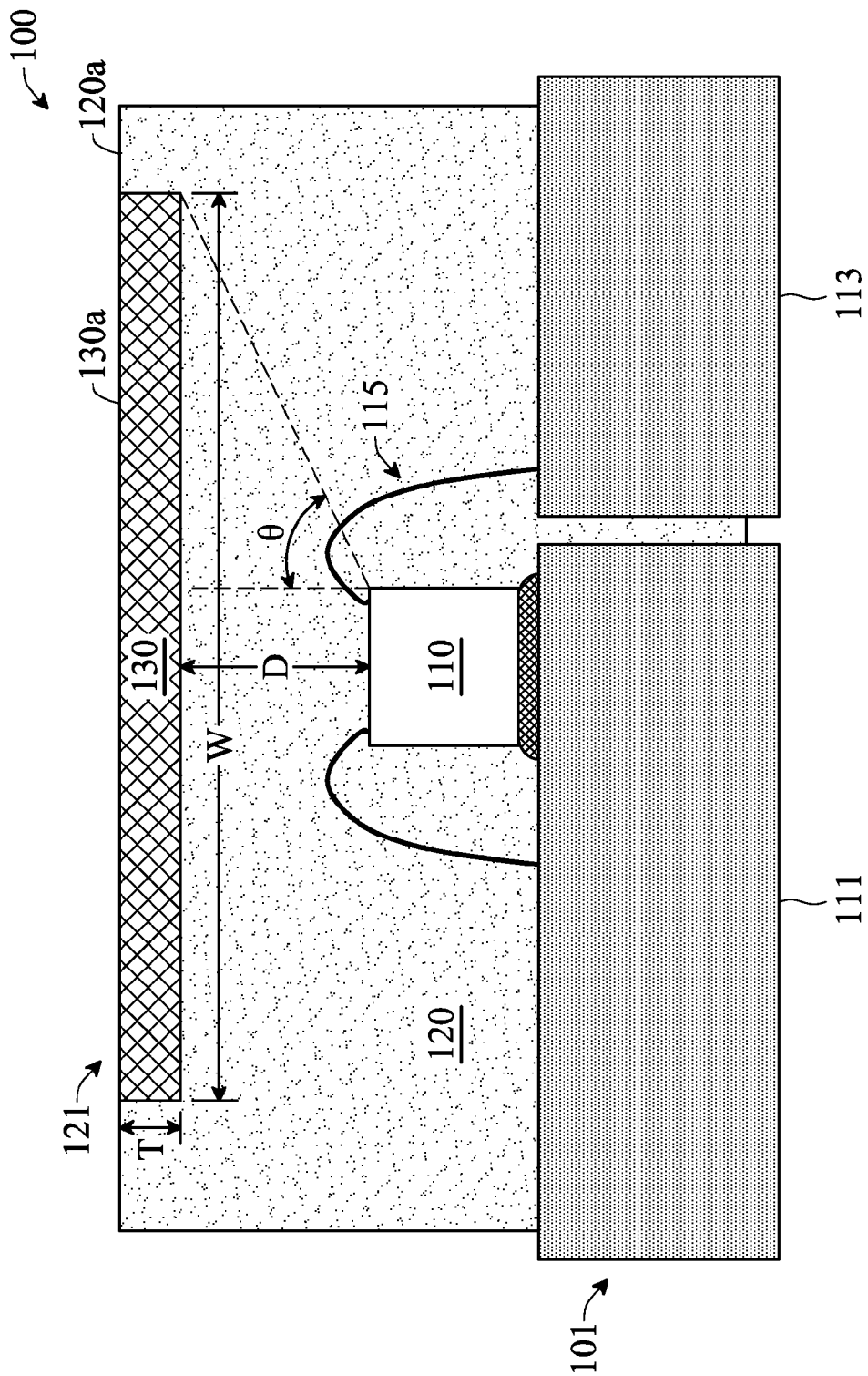
FIG. 1 is a schematic cross-sectional view illustrating an exemplary package system including a LED.

In general, a method of forming LED package systems bonds LEDs over a substrate. A molding structure having plurality of openings through the molding structure is made in advance. The molding structure having the openings is then mounted on the substrate, such that the LEDs each are disposed in the respective openings. The opening has a reflective surface along sidewalls of the opening, such that light emitted from the LED can be reflected on the reflector surface. A phosphor/silicone gel is then dispensed and filled within each opening, covering the LED.

Applicants found that the process for preparing the molding structure having reflective surfaces along sidewalls of the openings is complicated. It is also found that the phosphor added in the silicone gel may be randomly distributed. The bin (i.e., characteristics such as output, color, and voltage) of the LED packages may not be easily controlled.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a schematic cross-sectional view illustrating an exemplary package system including a light-emitting diode (LED). In FIG. 1, a LED package system 100 includes a LED 110 disposed over a surface of a substrate 101. In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In other embodiments, the alloy semiconductor substrate may have a gradient SiGe feature in which the Si and Ge composition change from one ratio at one location to another ratio at another location of the gradient SiGe feature. In still other embodiments, the alloy SiGe is formed over a silicon substrate. In yet still other embodiments, a SiGe substrate is strained. Furthermore, the semiconductor substrate may be a semiconductor on insulator, such as silicon on insulator (SOI), or a thin film transistor (TFT). In some examples, the semiconductor substrate may include a doped epitaxial (epi) layer or a buried layer. In other examples, the compound semiconductor substrate may have a multilayer structure, or the substrate may include a multilayer compound semiconductor structure. In some embodiments, the substrate 101 can include a transparent substrate. The transparent substrate can be, for example, a sapphire substrate, a glass substrate, an aluminum oxide substrate, or other transparent substrate.

In some embodiments, the LED 110 can include at least one N-type semiconductor material layer and at least one P-type semiconductor material. Depending on the emission color, the semiconductor material layers can include at least one material such as gallium arsenide (GaAs), aluminum gallium arsenide (AlGaAs), gallium arsenide phosphide (GaAsP), aluminum gallium indium phosphide (AlGaInP), gallium phosphide (GaP), gallium arsenide phosphide (GaAsP), aluminum gallium indium phosphide (AlGaInP), indium gallium nitride (InGaN), gallium nitride (GaN), aluminum gallium phosphide (AlGaP), zinc selenide (ZnSe), silicon carbide (SiC), silicon, carbon, boron nitride (BN), aluminum nitride (AlN), aluminum gallium nitride (AlGaN), aluminum gallium indium nitride (AlGaInN), other semiconductor materials, and/or any combinations thereof.

In embodiments, the LED 110 can optionally include at least one multiple-quantum-wells layer, a single-quantum-well layer, and/or a quantum-dots layer disposed between the N-type semiconductor material layer and the P-type semiconductor material. The quantum-wells or quantum-dots layer can be the layer where electrons and holes provided from the N-type semiconductor material layer and the P-type semiconductor material, respectively, recombine.

In some embodiments, the LED package system 100 can include conductive structures 111 and 113 that are electrically coupled with power sources with different voltage levels. For example, an electrode of the LED 110 can be electrically coupled with the conductive structure 113 through a wire 115. Another electrode of the LED 110 can be electrically coupled with the conductive structure 111 through another wire 115. In other embodiments, the electrode of the LED 110 can be electrically coupled with the conductive structure 113 through the wire 115. Another electrode of the LED 110 can be directly electrically coupled with the conductive structure 111 without the wire 115. In some embodiments, the conductive structures 111 and 113 can include a material such as a lead-free alloy (such as gold (Au) or a tin/silver/copper (Sn/Ag/Cu) alloy), a lead-containing alloy (such as a lead/tin (Pb/Sn) alloy), copper, aluminum, aluminum copper, conductive polymer, other bump metal material, and/or combinations thereof.

Referring to FIG. 1, the LED package system 100 can include a molding material 120 disposed over and covering the LED 110. In some embodiments, the molding material 120 can abut on the LED 110. In some embodiments, the molding material 120 can include a transparent silicone material, such that light generated from the LED 110 can pass through the molding material 120.

Referring again to FIG. 1, the LED package system 100 can include a phosphor-containing material 130 that can be disposed over and spaced from the LED 110 by the molding material 120. In some embodiments, the phosphor-containing material 130 can be disposed over and abut on the molding material 120. In other embodiments, the phosphor-containing material 130 can include phosphor and silicone. A ratio of phosphor to silicone is about 1:1 to about 5:1.

In some embodiments, the phosphor-containing material 130 has a thickness (T) ranging from about 30 μm to about 100 μm. Because phosphor of the phosphor-containing material 130 is confined within the thickness (T), the distribution of the phosphor in the phosphor-containing material 130 can be desirably controlled. In other embodiments, the phosphor-containing material 130 is spaced from the LED 110 by a predetermined distance (D) ranging from about 0.3 mm to about 1 mm. In still other embodiments, the phosphor-containing material 130 has a dimension (W) that is substantially parallel with the surface 101a of the substrate 101. The dimension W can range from about 1.2 mm to about 8.2 mm. In yet still other embodiments, an angle (θ) between a line along a side edge of the LED 110 and a line extending from a corner of the LED 110 to a corner of the phosphor-containing material 130 ranges from about 45° to about 75°. In some embodiments, the angle (θ) can be referred to as a bin pattern of the LED package system 100.

In some embodiments, the phosphor-containing material 120 can be disposed in an opening 121 of the molding material 120. A surface 130a of the phosphor-containing material 130 is substantially leveled with a surface 120a of the molding material 120. In other embodiments, the surface 130a of the phosphor-containing material 130 can be higher or lower than the surface 120a of the molding material 120. In still other embodiments, a lens (not shown) can be disposed over the phosphor-containing material 130. As shown in FIG. 1, the LED package system does not have a molding structure having a reflector.

Figure 2:
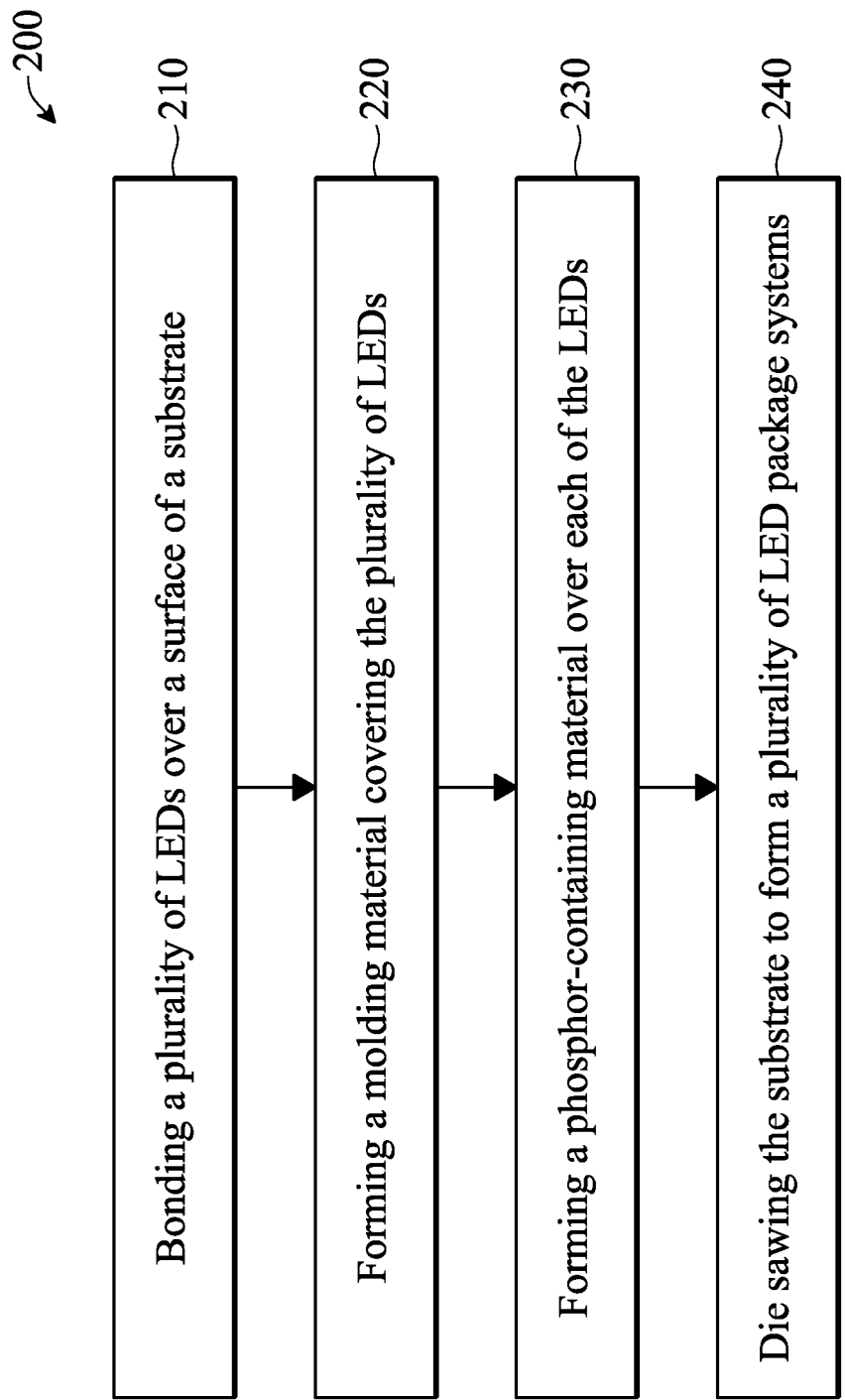
FIG. 2 is a flowchart of an exemplary method of forming an integrated circuit including a bipolar transistor.

FIG. 2 is a flowchart of an exemplary method of forming an integrated circuit including a bipolar transistor. FIGS. 3A-3D are schematic cross-sectional views of an integrated circuit during various fabrication stages. Items of a memory circuit 300 in FIGS. 3A-3D that are the same or similar items of the integrated circuit 100 in FIG. 1 are indicated by the same reference numerals, increased by 200. It is understood that FIGS. 2 and 3A-3D have been simplified for a better understanding of the concepts of the present disclosure. Accordingly, it should be noted that additional processes may be provided before, during, and after the methods of FIGS. 2 and 3A-3D, and that some other processes may only be briefly described herein.

Referring now to FIG. 2, the method 200 can include bonding a plurality of LEDs over a surface of a substrate (block 210). The method 200 can include forming a molding material covering the plurality of LEDs (block 220). The method 200 can include forming a phosphor-containing material over each of the LEDs (block 230). The method 200 can also include die sawing the substrate to form a plurality of LED package systems (block 240).

Figure 3A:
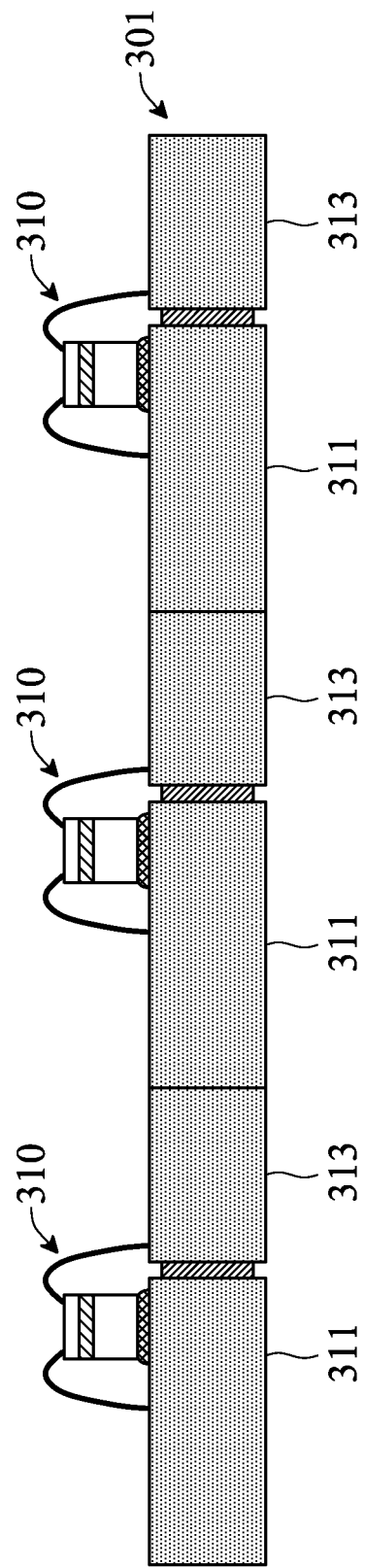
FIGS. 3A-3D are schematic cross-sectional views of an integrated circuit during various fabrication stages.

For example, the method 200 can include bonding a plurality of LEDs 310 over a surface of the substrate 301 as shown in FIG. 3A. In some embodiments, the LEDs 310 can each be bonded with respective conductive structures 311 and wire bonded with conductive structures 313.

Figure 3B:
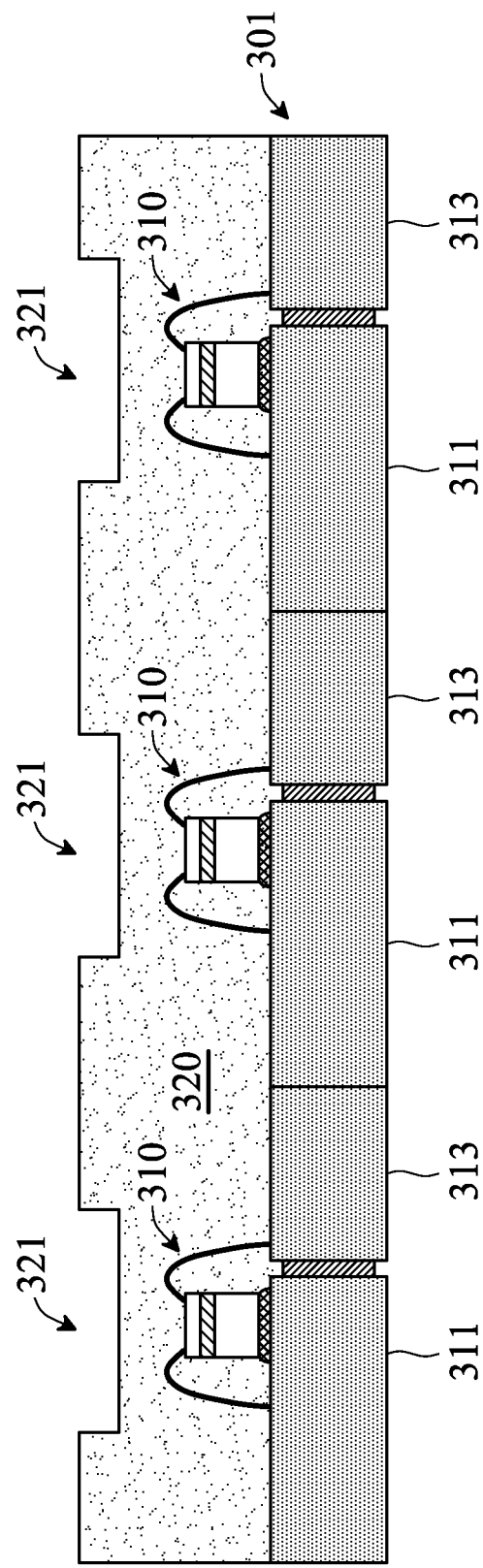

Referring to FIGS. 2 and 3B, the method 200 can include forming a molding material 320 covering the LEDs 310. In some embodiments, forming the molding material 320 can include forming a plurality of openings 321 into the molding material 320 and the openings 321 are each corresponding to the respective LEDs 310. In some embodiments, forming the molding material 320 can include a molding process. The molding process can form the molding material 320 and the openings 321 in the same process. By using the molding process, the molding material 320 with the openings 321 can be easily formed over and cover the LEDs 310. The method 200 of forming the LED package systems is less complicated and the cost of the method 200 is reduced.

Figure 3C:
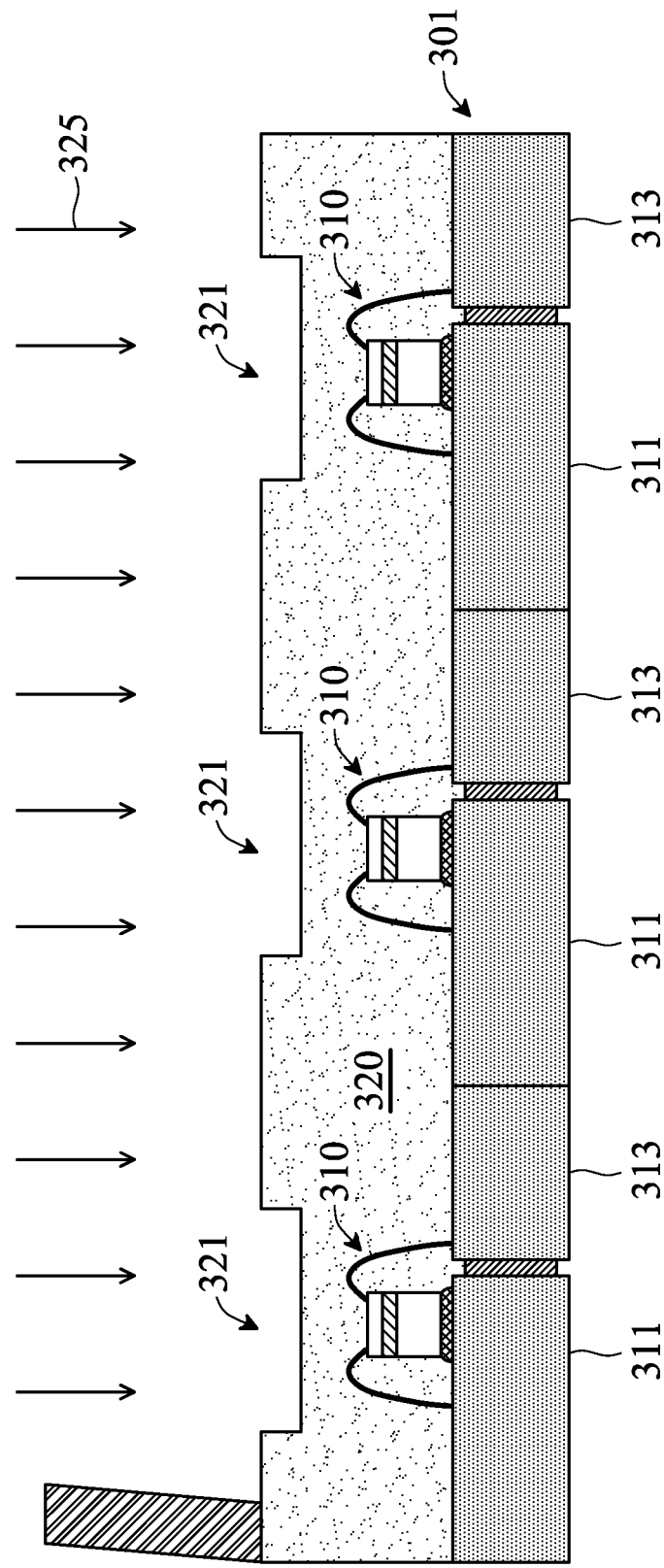
Figure 3D:
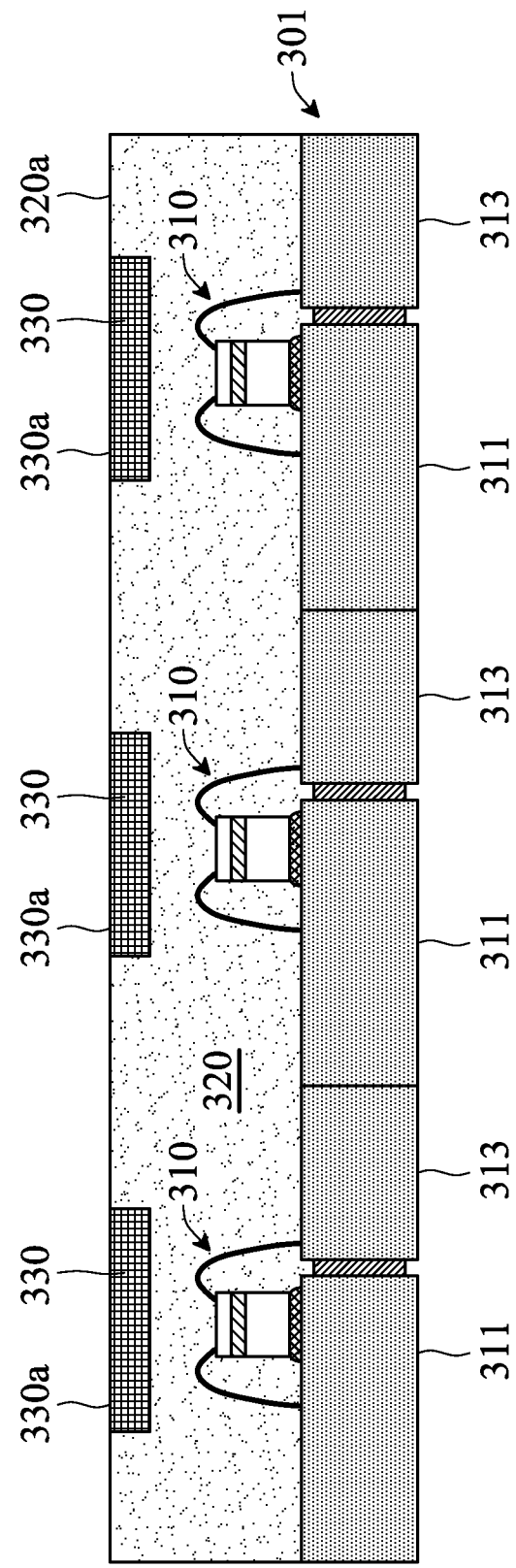

Referring to FIG. 2, the method 200 can include forming a phosphor-containing material over each of the LEDs (block 230). The phosphor-containing material is spaced from the respective LED by the molding material. For example, the block 230 can include printing a phosphor-containing material 325 into each of the openings 321 as shown in FIG. 3C. By printing the phosphor-containing material 325, phosphor-containing materials 330 can each be formed within the respective openings 321. Because the printing process can easily form the phosphor-containing materials 330 within the openings 321, the method 200 of forming the LED package systems can be easily achieved. In some embodiments, the surfaces 330a of the phosphor-containing materials 330 are substantially leveled with the surface 320a of the molding material 320 as shown in FIG. 3D. In other embodiments, the surfaces 330a of the phosphor-containing materials 330 are higher or lower than the surface 320a of the molding material 320.

After the formation of the phosphor-containing materials 330, the substrate 301 and the structure formed thereon are subjected to a die sawing process as shown in block 240 of FIG. 2. In some embodiments, the die sawing process can include a blade sawing process and/or a laser sawing process.

In a first exemplary embodiment of this application, a light-emitting diode (LED) package system includes a LED disposed over a surface of a substrate. A molding material covers the LED. A phosphor-containing material is disposed over and spaced from the LED by the molding material.

In a second exemplary embodiment of this application, a method of forming LED package systems includes bonding a plurality of LEDs over a surface of a substrate. A molding material is formed to cover the LEDs. A phosphor-containing material is formed over each of the LEDs. The phosphor-containing material is spaced from the respective LED by the molding material. The substrate can be die sawed to form a plurality of LED package systems.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light-emitting diode (LED) package system comprising:
    a LED disposed over a surface of a substrate, wherein the LED is free of being surrounded by a reflector cup;
    a molding material covering the LED; and
    a phosphor-containing material disposed over, but does not circumferentially surround, the LED, the phosphor-containing material being spaced from the LED by the molding material, wherein the phosphor-containing material contains silicone, and wherein the phosphor-containing material is disposed in an opening of the molding material, and a surface of the phosphor-containing material is substantially leveled with a surface of the molding material.

2. The package system of claim 1, wherein the phosphor-containing material has a ratio of phosphor to silicone of about 1:1 to about 5:1.

3. The package system of claim 1, wherein the phosphor-containing material has a thickness ranging from about 30 μm to about 100 μm.

4. The package system of claim 1, wherein the phosphor-containing material is spaced from the LED by a predetermined distance ranging from about 0 3 mm to about 1 mm.

5. The package system of claim 4, wherein the phosphor-containing material has a dimension that is substantially parallel with the surface of the substrate ranging from about 1 2 mm to about 8.2 mm.

6. The package system of claim 1, wherein a bin pattern of the package system ranges from about 45° to about 75°.

7. A light-emitting diode (LED) package system comprising:
    a plurality of LEDs disposed over a surface of a substrate;
    a molding material disposed over and abutting on each of the LEDs, the molding material having a plurality of openings each being aligned with a respective one of the LEDs, and wherein portions of the molding material separating the LEDs contain no reflector plates; and
    a phosphor-containing material disposed over and abutting on the molding material, wherein the phosphor-containing material is disposed in each of the openings, and a surface of the phosphor-containing material is substantially leveled with a surface of the molding material.

8. The package system of claim 7, wherein the phosphor-containing material includes phosphor and silicone and a ratio of phosphor to silicone is about 1:1 to about 5:1.

9. The package system of claim 7, wherein the phosphor-containing material has a thickness ranging from about 30 μm to about 100 μm.

10. The package system of claim 7, wherein the phosphor-containing material is spaced from the LED by a predetermined distance ranging from about 0 3 mm to about 1 mm.

11. The package system of claim 10, wherein the phosphor-containing material has a dimension that is substantially parallel with the surface of the substrate ranging from about 1.2 mm to about 8.2 mm.

12. The package system of claim 7, wherein a bin pattern of the package system ranges from about 45° to about 75°.

13. A packaging structure, comprising:
    a substrate;
    a plurality of light-emitting diodes (LEDs) bonded to the substrate;
    a molding structure disposed over the substrate in a manner such that the LEDs are embedded within the molding structure, wherein the molding structure includes a plurality of recesses that are each aligned with a respective one of the LEDs, and wherein no reflector plates are embedded within the molding structure; and
    a plurality of phosphor elements filling the recesses, respectively, wherein the phosphor elements are flush with the molding structure.

14. The packaging structure of claim 13, wherein the molding structure contains a transparent silicone material.

15. The packaging structure of claim 13, wherein the phosphor elements contain phosphor and silicone, and wherein a ratio of the phosphor to the silicone is in a range from about 1:1 to about 5:1.

16. The packaging structure of claim 13, wherein the phosphor elements each have a thickness in a range from about 30 μm to about 100 μm.

17. The packaging structure of claim 13, wherein the phosphor elements each have a lateral dimension in a range from about 1.2 mm to about 8.2 mm.

18. The packaging structure of claim 13, wherein a distance separating the phosphor elements from the LEDs is in a range from about 0 3 mm to about 1 mm.

* * * * *